(12) United States Patent
Horiuchi et al.

(10) Patent No.: US 6,335,493 B1
(45) Date of Patent: Jan. 1, 2002

(54) MULTILAYER WIRING BOARD

(75) Inventors: Michio Horiuchi; Shigetsugu Muramatsu, both of Nagano (JP)

(73) Assignee: Shinko Electric Industries, Co., Ltd., Nagano (JP)

(*) Notice: Subject to any disclaimer, the term of this patent is extended or adjusted under 35 U.S.C. 154(b) by 0 days.

(21) Appl. No.: 09/450,140

(22) Filed: Nov. 29, 1999

(30) Foreign Application Priority Data

Dec. 1, 1998 (JP) .......................................... 10-341502

(51) Int. Cl.[7] .......................... H01R 12/04; H05K 1/11
(52) U.S. Cl. ...................................... 174/261; 174/260
(58) Field of Search ................................. 174/260, 261; 861/767, 768, 769, 770, 771, 772, 773, 774, 775, 776, 777, 778, 779

(56) References Cited

U.S. PATENT DOCUMENTS

| | | | | |
|---|---|---|---|---|
| 4,495,377 A | * | 1/1985 | Johnson et al. | 174/68.5 |
| 6,008,532 A | * | 12/1999 | Carichner | 257/691 |
| 6,040,984 A | * | 3/2000 | Hirakawa | 361/777 |
| 6,121,554 A | * | 9/2000 | Kamikawa | 174/260 |

FOREIGN PATENT DOCUMENTS

| | | |
|---|---|---|
| EP | 0 883 182 A2 | 12/1998 |
| EP | 0 921 567 A2 | 6/1999 |
| EP | 0 928 029 A2 | 7/1999 |
| JP | 11260956 | 9/1999 |
| JP | 11297885 | 10/1999 |

OTHER PUBLICATIONS

Winkler, Ernel, "Escape Routing From Chip Scale Packages", IEEE 19:393–401, Oct. 14, 1996.

Gasparini, Nicole M. et al., "A Method of Designing a Group of Bumps for C4 Packages to Maximize the Number of Package Layers", IEEE, 695–699, 1994.

* cited by examiner

*Primary Examiner*—Jeffrey Gaffin
*Assistant Examiner*—Jeremy Norris
(74) *Attorney, Agent, or Firm*—Pennie & Edmonds LLP (57) ABSTRACT

A multilayer wiring board for mounting a semiconductor chip or a semiconductor device, in which the number of wiring layers in minimized, having a plurality of wiring layers, in which each of said wiring layers includes lands arranged in the form of a square lattice and wiring patterns each having one end connected to one of said lands and the other end extending outward beyond an outermost row of said lattice, said lands having a land pitch p and a land diameter d and said wiring patterns having a pattern width w and an interpattern space s, said p, d, w, and s satisfying the following relationship:

$$p-d<2s+w$$

and

$$(2) p-d \geq 2s+w,$$

wherein said lattice has periodic land-free or vacant lattice sites, all lands in said outermost row have wiring patterns extending outward therefrom, and said land-free or vacant lattice sites provide a space through which wiring patterns extend outward therefrom, and said land-free or vacant lattice sites provide a space through which wiring patterns extend outward from, and are connected to, lands of an inner row.

4 Claims, 8 Drawing Sheets

MULTILAYER WIRING BOARD

BACKGROUND OF THE INVENTION

1. Field of the Invention

The present invention relates to a multilayer wiring board for mounting thereon an electronic element such as a semiconductor chip having connection electrodes arranged in the form of a lattice or a semiconductor device having connection terminals arranged in the form of an area array.

2. Description of the Related Art

Figure 1:
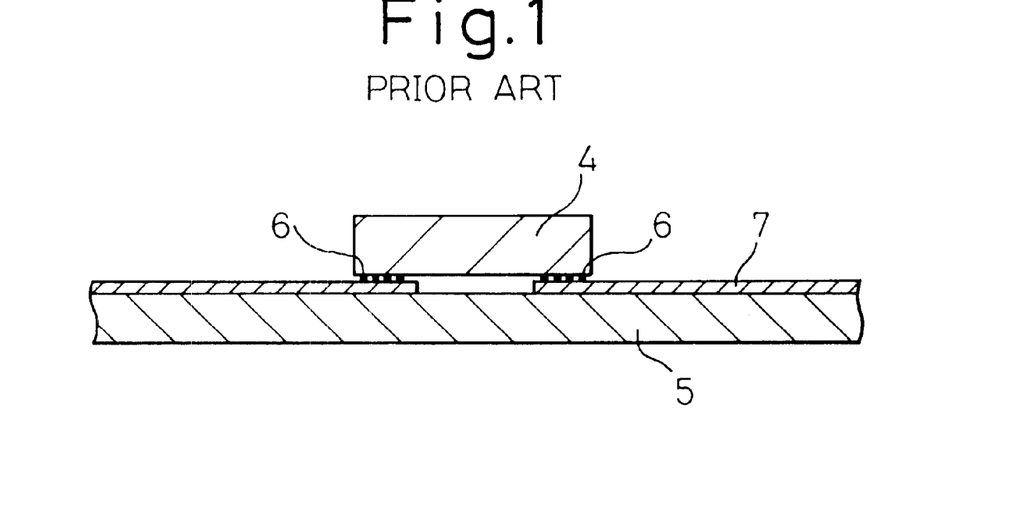
FIG. 1 shows a semiconductor device including a semiconductor chip mounted on a wiring board by flip-chip bonding, in a cross-sectional view.

FIG. 1 is a cross-sectional view of a circuit board 5 having a semiconductor chip 4 mounted thereon by flip-chip bonding. The semiconductor chip 4 has an electrode carrying surface having a peripheral zone in which electrode terminals 6 are arranged in two rows and each thereof is electrically connected to one of wiring patterns 7 on the circuit board 5.

Figure 2:
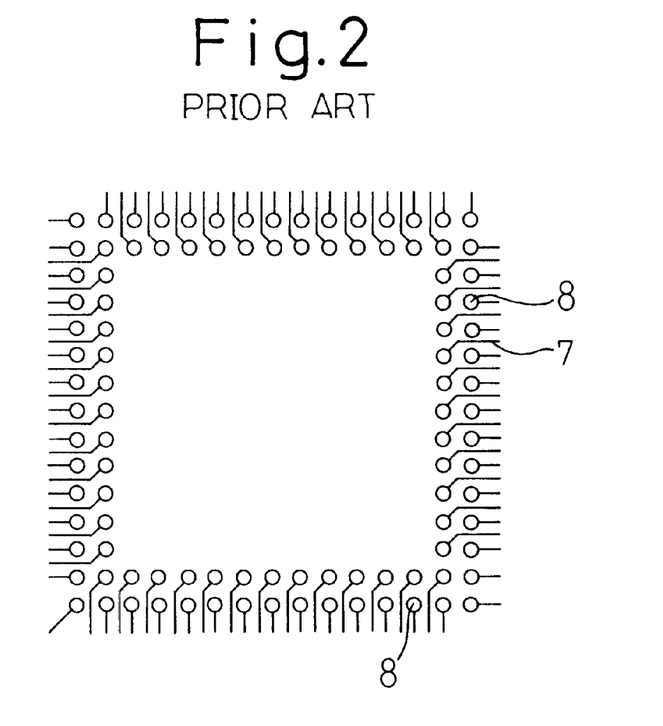
FIG. 2 shows a conventional arrangement of lands having wiring patterns extending outward therefrom, in a plan view.

FIG. 2 is a plan view of the circuit board 5 having lands 8 provided thereon and the wiring patterns 7 connected to the lands 8. The lands 8 are arranged in positions corresponding to that of the electrode terminals 6 of the semiconductor chip 4 and each of the lands 8 is connected to one of the wiring patterns 7.

In the shown arrangement, the lands 8 are arranged in two rows in the same manner as the electrode terminals 6 and the lands 8 of the outer row have wiring patterns 7 extending outward directly therefrom and the lands 8 of the inner row have wiring patterns 7 extending outward therefrom through spaces between the lands 8 of the outer row. In the arrangement shown in FIG. 2, the number of the lands 8 is not large and the wiring patterns 7 can extend outward in one layer through spaces between the outer lands 8 from all of the inner lands 8 without difficulty.

However, when the number of the electrode terminals 6 of the semiconductor chip 4 is large, the wiring patters 7 cannot extend outward in one layer from all of the inner lands 8, depending on the land pitch and the number of lands.

Figure 3:
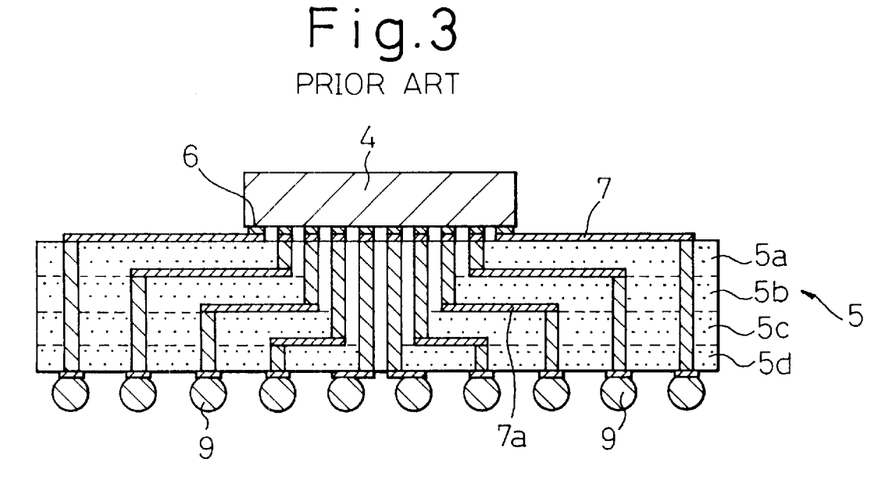
FIG. 3 shows a semiconductor device including a semiconductor chip mounted on a multilayer wiring board, in a cross-sectional view.

The circuit board 5 mounts the semiconductor chip 4 thereon by electrically connecting the electrode terminals 6 of the semiconductor chip 4 to external connection terminals of the circuit board 5 via the wiring patterns 7. As shown in FIG. 3, when the number of the electrode terminals 6 is extremely large, wiring patterns 7 are formed in a plurality of layers to enable all electrode terminals 6 of a semiconductor chip 4 to be electrically connected to external connection terminals 9 of a circuit board 5. The symbol "7a" denotes inner wiring patterns and the symbols "5a" to "5d" denote wiring layers which constitute a multilayer wiring board 5.

When the number of electrode terminals 6 of a semiconductor chip 4 is not much large, a multilayer wiring board 5 only includes several wiring layers. However, when electrode terminals 6 are arranged in a much larger lattice such as 30×30 pins or 40×40 pins and at a reduced pitch of electrode terminals, a multilayer wiring board must include wiring layers in an increased number such as six to ten.

A multilayer wiring board for mounting a semiconductor device is produced by build-up method or other methods which enable wiring patterns to be formed in an increased density. However, the method of forming wiring patterns at high density to form multiple layers has problems in product yield, product reliability, and production cost. Specifically, a multilayer wiring structure is produced by a process including layer-by-layer forming wiring patterns and vias electrically connecting wiring patterns of adjoining layers, which process requires high precision and does not provide good reliability. Moreover, as the number of wiring layers is increased, it becomes more difficult to to ensure that all wiring layers contain no defects.

Therefore, the number of wiring layers of a multilayer wiring board should advantageously be reduced to ensure good product yield, product reliability and production cost.

SUMMARY OF THE INVENTION

The present invention is directed to a multilayer wiring board for mounting electronic elements such as a semiconductor chip having electrode terminals in a large number such as 40×40 pins or a semiconductor device having a mounting surface on which a large number of connection terminals are arranged to form an area array.

The object of the present invention is to provide a multilayer wiring board for mounting a semiconductor chip or a semiconductor device, in which the number of wiring layers is minimized to provide improved product yield, product reliability and production cost.

To achieve the object according to the present invention, there is provided a multilayer wiring board having a plurality of wiring layers, in which each of said wiring layers includes lands arranged in the form of a square lattice and wiring patterns each having one end connected to one of said lands and the other end extending outward beyond an outermost row of said lattice, said lands having a land pitch p and a land diameter d and said wiring patterns having a pattern width w and an interpattern space s, said p, d, w and s satisfying the following relationship:

$$p-d<2s+w$$

and $$(\sqrt{2})p-d \geq 2s+w,$$

wherein said lattice has periodic land-free or vacant lattice sites, all lands in said outermost row have wiring patterns extending outward therefrom, and said land-free or vacant lattice sites provide a space through which wiring patterns extend outward from, and are connected to, lands of an inner row.

The present invention provides a multilayer wiring board having an improved arrangement of wiring patterns in each wiring layer to enable the number of wiring layers to be reduced.

The multilayer wiring board of the present invention may be produced by any of existing processes for producing a multilayer wiring board such as build-up method, etc.

Electronic elements such as a semiconductor chip or a semiconductor device have electrode terminals or connection terminals, which are usually arranged in the form of a square lattice. In order to reduce the number of wiring layers of a multilayer wiring board, the arrangement of wiring patterns in a wiring layer must be designed to provide efficient outward extension of wiring patterns from the lattice of electrode terminals or connection terminals with a minimized number of wiring layers.

Because wiring patterns usually extend outward through a space between adjacent lands, the arrangement of wiring patterns is generally designed in accordance with given conditions of a land pitch, a land diameter, a pattern width, and an interpattern space.

The multilayer wiring structure of the present invention is applied to the wiring pattern arrangement in which the land pitch p, the land diameter d, the pattern width w and the interpattern space s have a relationship therebetween which satisfies the following formula 1) and 2):

$$P-d<2s+w, \quad \quad 1)$$

and $$(\sqrt{2})p-d \geq 2s+w. \quad \quad 2)$$

Figure 4:
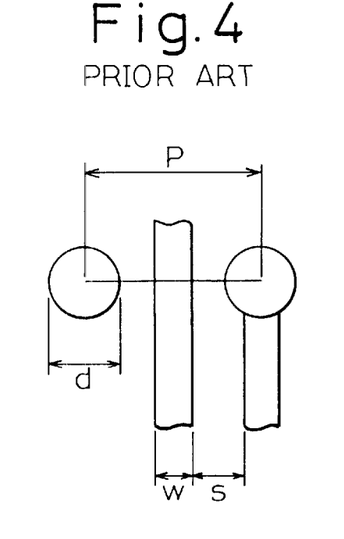
FIG. 4 shows a dimensional condition including land pitch, land diameter, wiring pattern width and interpattern space, in a plan view.

The present invention provides the most efficient outward extension of wiring patterns from lands under this condition. FIG. 4 shows the definition of the land pitch p, the land diameter d, the pattern width w and the interpattern space s. The land pitch p refers to the distance between centers of adjacent lands and the interpattern space s refers to a required minimum distance between adjacent wiring patterns.

The formula 1) and 2) define a condition in which electrode terminals of a semiconductor chip or connection terminals of a semiconductor device or other electronic elements are very close to each other so that even one wiring pattern cannot pass through a space between adjacent lands which form a side of a square lattice unit with the four corners each occupied by one land while at least one wiring pattern can pass through a space defined by the diagonal segment of the square lattice unit.

In a multilayer wiring board, when a land in a first wiring layer has a wiring pattern extending outward therefrom, a land in the corresponding position in the adjoining second wiring layer need not have a wiring pattern extending outward therefrom, and therefore, outward extension of wiring pattern may only be considered for the other lands in the second wiring layer that have no corresponding lands having wiring patterns extending outward therefrom in the first wiring layer. This means that designing of the wiring pattern must include consideration as to how wiring patterns can extend outward in the second wiring layer in accordance with the outward extension of wiring patterns in the first wiring layer.

The outward extension of wiring pattern is designed on the following basic rule.

In a row of n continuous lands from a square lattice arrangement of lands, when n−2 intermediate lands are removed from the row to form a space between two lands at both ends of the row, m wiring patterns can pass the space, in which the number m is given by the integer part of:

$$(p(n-1)-d-s)/(w+s),$$

where p: land pitch,
d: land diameter,
w: pattern width, and
s: interpattern space.

In the present invention, the wiring pattern is designed on this rule and under the limitation defined by the formula 1) and 2).

In the square lattice arrangement of lands under the limitations 1) and 2), no wiring pattern can pass through the space between two adjacent lands. Therefore, if the conventional outward extension design were applied to this lattice, the outward extension would have to be effected for lands of the outermost row alone for each wiring layer. In the lattice forming an n×n matrix of lands, about n/2 wiring layers would be required. This number of wiring layers is about twice that required in a square lattice in which one wiring pattern can pass a space between two adjacent lands, so that no efficient outward extension can be achieved from the viewpoint of the practically acceptable production step number and production cost, particularly when the lattice size or the value n is very large.

To solve this conventional problem, the present invention provides a practically acceptable, efficient outward extension by using a square lattice of lands which includes at least the outermost row of lands having periodic land-free or vacant lattice sites at an interval.

The land-free or vacant lattice sites are disposed to enable outward extension from lands of inner rows as well as lands of the outermost row. The land-free lattice sites are advantageously positioned to provide the substantially the same efficiency in the outward extension of wiring patterns in a wiring layer as that obtained when one wiring pattern can pass through the space between two adjacent lands.

The land-free lattice sites may be provided not only in the outermost row but also in the inner rows and may be provided either in a row or rows in one direction at an interval or in two or more vertically intersecting rows at respective intervals.

In practice, the proportion of the number of land-free lattice sites to the total number of lattice sites can be about 10% or less to provide sufficient effect. The proportion can be further reduced when lands in the core portion of a lattice are used for power supply or ground and need not have wiring patterns outward extending therefrom.

The positions of land-free lattice sites may be determined on the above-mentioned rule for the number m to provide a highest efficiency. Specifically, the wiring pattern arrangement is designed by so determining the positions of land-free or vacant lattice sites as to provide the most efficient outward extension of wiring patterns based on the specific land pitch, land diameter, wiring pattern width and interpattern space.

DESCRIPTION OF THE PREFERRED EMBODIMENTS

EXAMPLE 1

Figure 5:
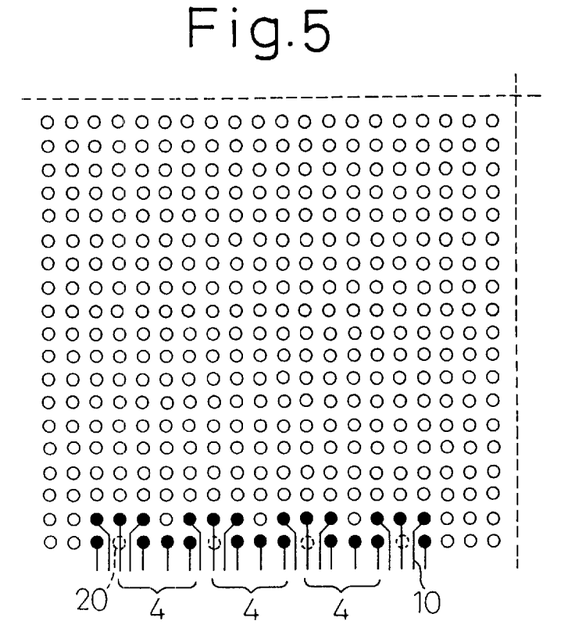
FIG. 5 shows the first wiring layer of a multilayer wiring board of Example 1 according to the present invention, including wiring patterns extending outward from lands of the first or outermost and the second rows, in a plan view.
Figure 6:
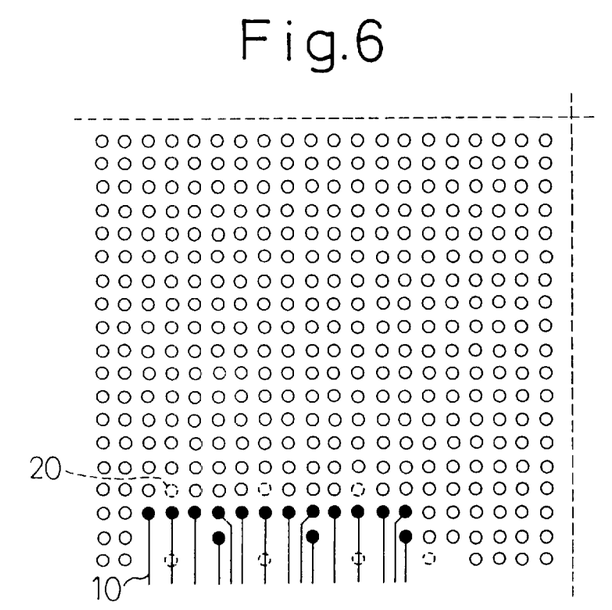
FIG. 6 shows the second wiring layer of the multilayer wiring board of Example 1, including wiring patterns extending outward from lands of the second and the third rows, in a plan view.

FIGS. 5 and 6 show a wiring pattern arrangement in a square lattice of lands according to the present invention, in which the lattice is in the dimensional condition that no wiring pattern can pass through the space between two adjacent lands and one wiring pattern can pass through the space between two diagonally located lands and that three wiring patterns can pass through a space defined by two land pitches, more exactly, a face-to-face distance between two lands in the same row that are distant from each other by a center-to-center distance of two land pitches, i.e., a space which will open when an intermediate land is removed from three successive lands.

For example, these conditions are satisfied when the parameters p, d, w and s take the following values:
1)
  land pitch: 180 μm,
  land diameter: 100 μm,
  pattern width: 30 μm, and
  interpattern space: 30 μm.
2)
  land pitch: 160 μm,
  land diameter: 80 μm,
  pattern width: 30 μm, and
  interpattern space: 30 μm.
3)
  land pitch: 250 μm,
  land diameter: 110 μm,
  pattern width: 50 μm, and
  interpattern space: 50 μm.

FIG. 5 shows an outward extension of wiring patterns 10 in the first wiring layer, in which wiring patterns 10 are extended from one of four sides of a square lattice of lands. One land-free or vacant lattice site is provided in every four lattice sites. Because three wiring patterns 10 can be extended in two land pitches under the above-mentioned condition, the shown manner of outward extension allows wiring patters to be extended from lands of both the outermost row and the adjacent inner row. The solid circles represent lands from which wiring patterns 10 extend outward. The broken line circles represent land-free or vacant lattice sites 20.

FIG. 6 shows an outward extension of wiring patterns 10 in the second wiring layer. In the first wiring layer, wiring patterns 10 are extended from almost all lands of the outermost or first row and the adjacent inner or second row, so that wiring patterns 10 can be extended from the rest of the lands of the second row and from almost all lands of the third row in the second wiring layer. Therefore, in the third wiring layer, outward extension of wiring patterns is effected by providing land-free lattice sites at an interval with one vacant site for every four sites in the same manner as in the first wiring layer, to achieve efficient outward extension of wiring patterns. Thus, the multilayer wiring board of the shown example has a structure in which every two wiring layers have the same arrangement of wiring patterns.

Figure 7:
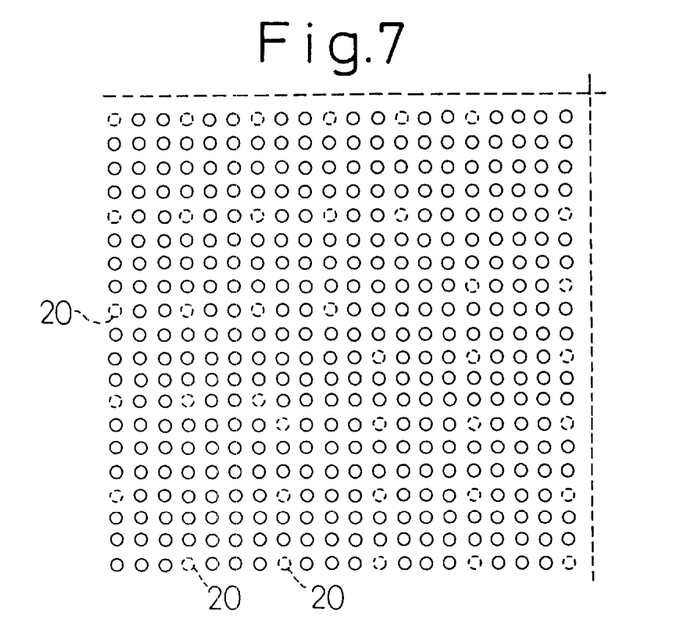
FIG. 7 shows the positions of vacant sites in the square lattice of lands in Example 1, in a plan view.

In this example, as shown in FIG. 7, efficient outward extension of wiring patterns is achieved by providing one vacant site 20 in every four lattice sites in the abscissa rows and one vacant site 20 in every three lattice sites in the ordinate rows.

The square lattice in this example thus contains about 10% vacant lattice sites based on the total lattice sites. This is quite astonishing because only about 10% vacant sites ensure extremely efficient outward extension of wiring patterns by achieving outward extension of wiring patterns from substantially three rows by using two wiring layers under the condition that no wiring pattern can pass through a space between two adjacent lands.

A square lattice of 40×40 (=1600) lands is usually designed to have a core region including 30% of the total lands (22×22 (=484) lands from 1600 lands, for example) that are used for power/ground lines.

In this case, the present invention ensures that wiring patterns as signal lines can be extended outward from the rest of lands by using six layers, which is much less than nine layers which would be required in the prior art multilayer wiring board.

Moreover, three from 22×22 lattice sites for power/ground lines in the core region may also be used as vacant lattice sites to provide a further improved efficiency of outward extension of wiring patterns.

EXAMPLE 2

Figure 8:
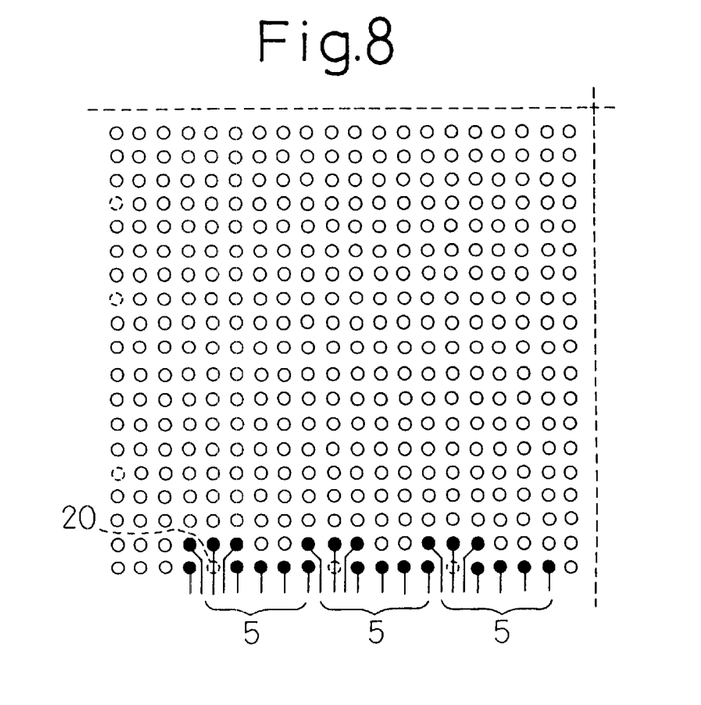
FIG. 8 shows the first wiring layer of a multilayer wiring board of Example 2 according to the present invention, including wiring pattern extending outward from lands of the first or outermost and the second rows, in a plan view.
Figure 9:
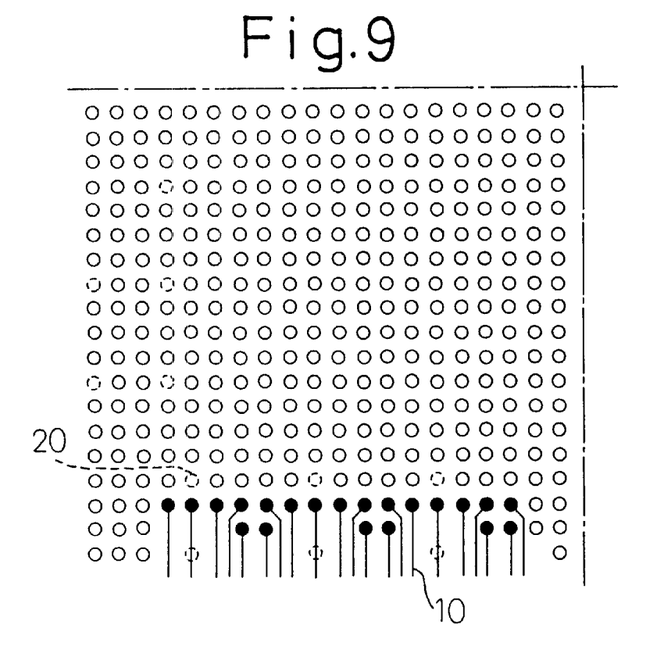
FIG. 9 shows the second wiring layer of the multilayer wiring board of Example 2, including wiring patterns extending outward from lands of the second and the third rows, in a plan view.

FIGS. 8 and 9 show another wiring pattern arrangement, in a square lattice of lands according to the present invention, in which the lattice is in the same dimensional condition as in Example 1 and in which outward extension of wiring patterns is effected by providing one vacant site 20 in every five lattice sites. FIG. 8 shows an example of outward extension of wiring patterns in the first wiring layer and FIG. 9 shows an example of outward extension of wiring patterns in the second wiring layer.

As can be seen from FIG. 9, wiring patterns are extended outward from the first or outermost, the second and the third layers by using two wiring layers, i.e., outward extension of wiring patterns from substantially three rows is also achieved by using two wiring layers in this example.

Figure 10:
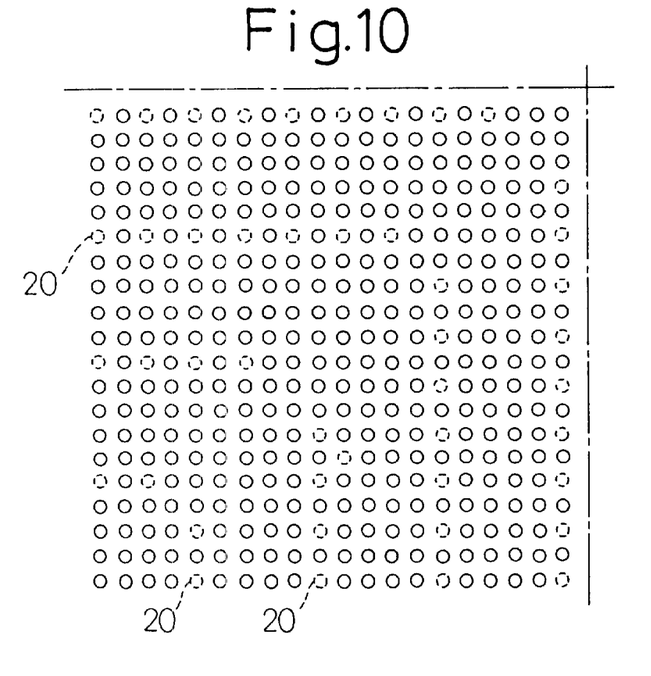
FIG. 10 shows the positions of vacant sites in the square lattice of lands in Example 2, in a plan view.

FIG. 10 shows a modified wiring pattern arrangement in a square lattice of lands according to the present invention, which includes one vacant site 20 in every five lattice sites in the abscissa rows and one vacant site 20 in every two lattice sites in the ordinate rows.

Even with such a low frequent provision of vacant lattice sites, outward extension of wiring patterns from substantially three rows is achieved by using two wiring layers to provide an extremely high efficiency in comparison with the prior art in which no vacant lattice sites are provided and wiring patterns are extended outward from the outermost row alone in every one wiring layer.

The square lattice in this example also contains about 10% vacant lattice sites based on the total lattice sites.

EXAMPLE 3

In the preceding examples, suitable positioning of vacant sites 20 ensures that wiring patterns are extended outward from substantially two rows by using one wiring layer.

Figure 11:
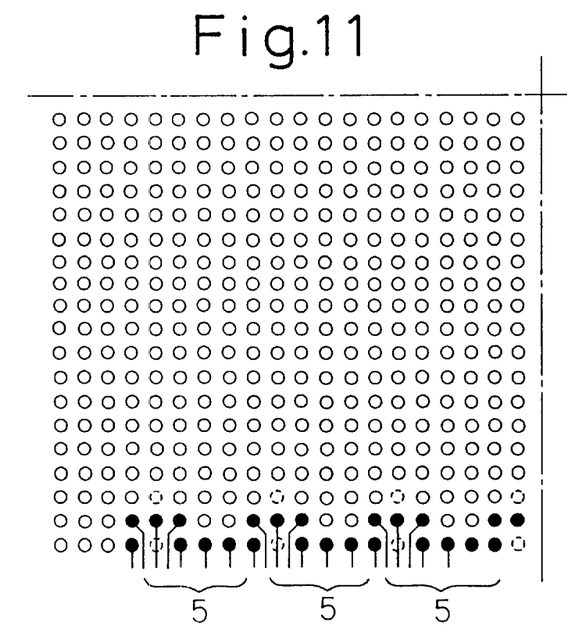
FIG. 11 shows the first wiring layer of a multilayer wiring board of Example 3 according to the present invention, including wiring patterns extending outward from lands of the first or outermost and the second rows, in a plan view.
Figure 12:
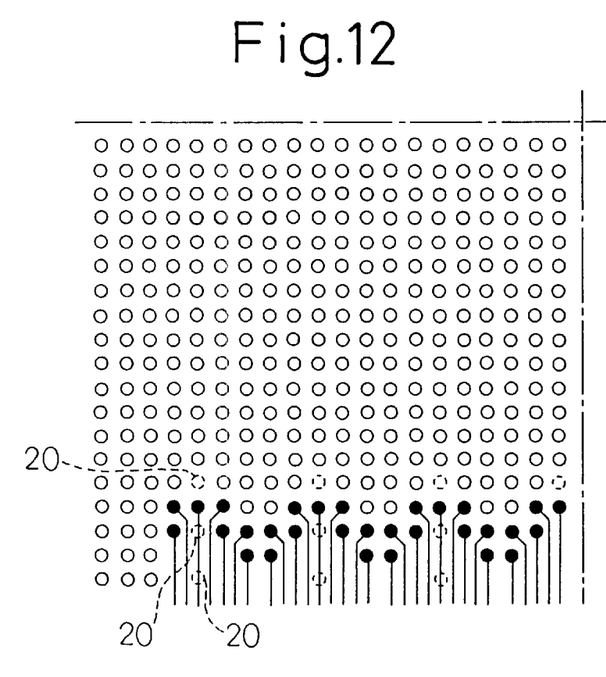
FIG. 12 shows the second wiring layer of the multilayer wiring board of Example 3, including wiring patterns extending outward from lands of the second, the third and the fourth rows, in a plan view.

FIGS. 11 and 12 show a wiring pattern arrangement in a square lattice of lands according to the present invention, in which vacant lattice sites are provided in the same manner as shown in FIG. 10 and wiring patterns have a modified form to ensure that wiring patterns are extended outward from substantially two rows in each wiring layer.

In this example, wiring patterns are extended outward from substantially two rows in each wiring layer by providing one vacant site 20 in every five lattice sites in the abscissa rows and one vacant site 20 in every tow lattice sites in the ordinate rows.

EXAMPLE 4

Figure 13:
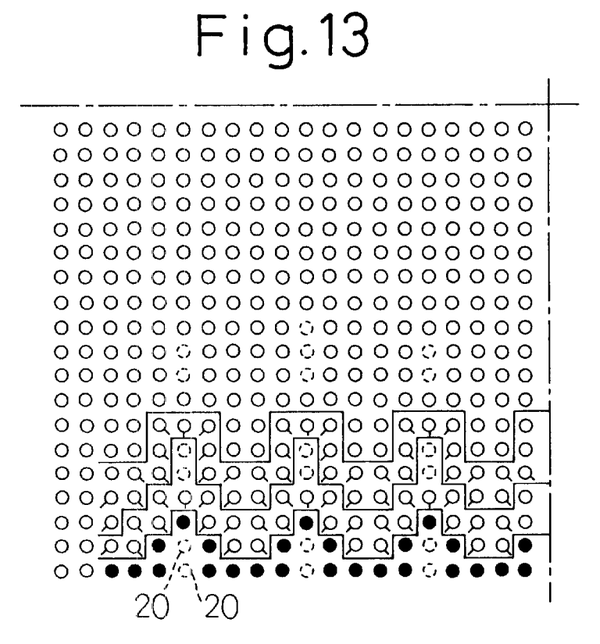
FIG. 13 shows wiring layers of a multilayer wiring board of Example 4 according to the present invention, including wiring patterns extending outward from lands of the first or outermost to the seventh rows, in a plan view.
Figure 14:
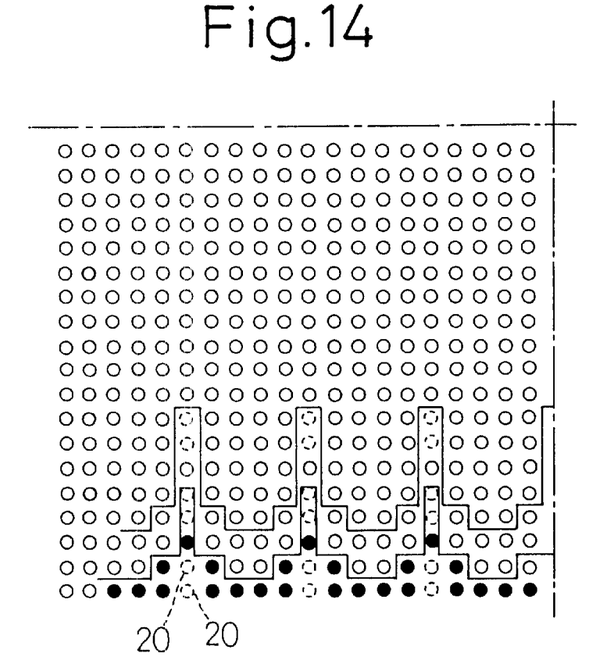
FIG. 14 shows wiring layers of another multilayer wiring board of Example 4, including wiring patterns extending outward from lands of the first or outermost to the third rows, in a plan view.

FIGS. 13 and 14 show a wiring pattern arrangement in a square lattice of lands according to the present invention, in which the lattice is in the same dimensional condition as in Example 1 and in which one vacant site 20 is provided in every five lattice sites in the outermost row in the abscissa direction and two successive vacant sites 20 are provided in every three lattice sites in the ordinate rows extending inward from the above-mentioned one vacant lattice site of the outermost row.

In the preceding examples, provision of vacant lattice sites facilitates outward extension of wiring patterns from inner rows, so that wiring patterns are extended outward from eight rows including the outermost to the eighth rows by using four wiring layers.

In this example, plural successive vacant sites 20 are provided to further facilitate outward extension of wiring patterns from inner rows.

EXAMPLE5

Figure 15:
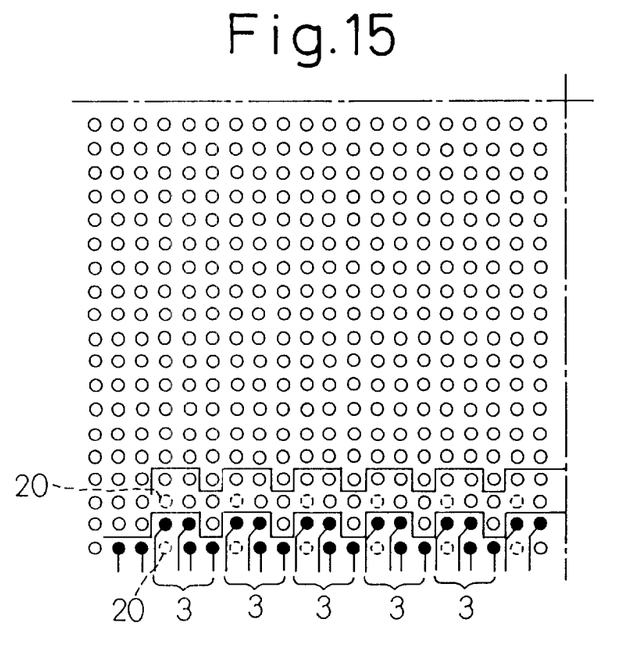
FIG. 15 shows wiring layers of a multilayer wiring board of Example 5 according to the present invention, including wiring patterns extending outward from lands of the first or outermost and the second rows, in a plan view.
Figure 16:
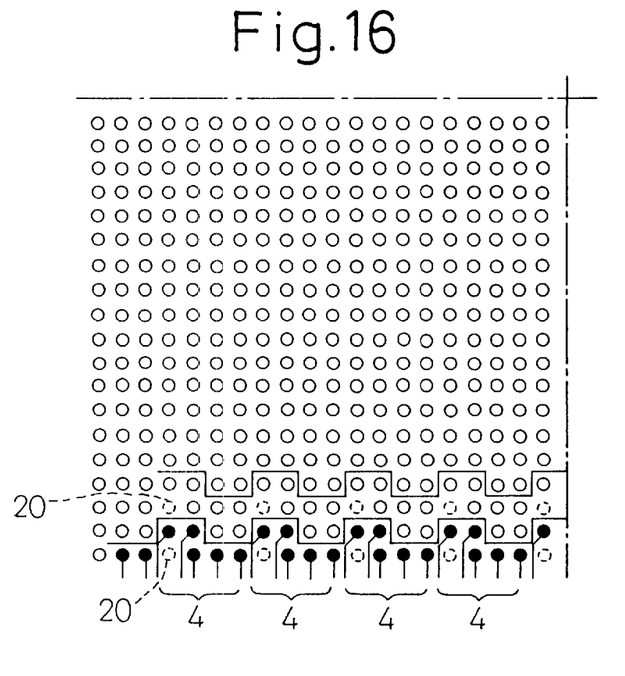
FIG. 16 shows wiring layers of a multilayer wiring board of Example 5, including wiring patterns extending outward from lands of the first or outermost and the second row, in a plan view.

FIGS. 15 and 16 show a wiring pattern arrangement in a square lattice of lands according to the present invention, in which the lattice is in the same dimensional condition as in Example 1, except that only two wiring patterns can pass through a space defined by two land pitches, more exactly, a face-to-face distance between two lands in the same row that are distant from each other by a center-to-center distance of two land pitches, i.e., a space which will open when an intermediate land is removed from three successive lands.

For example, these conditions are satisfied when the parameters p, d, w and s take the following values:

4)
land pitch: 250 μm,
land diameter: 130 μm,
pattern width: 70 μm, and
interpattern space: 70 μm.

FIG. 15 shows a lattice in which one vacant site 20 is provided in every three lattice sites and FIG. 16 shows a lattice in which one vacant site 20 is provided in every four lattice sites.

In either cases, wirinq patterns are extended outward from substantially all lands of four outer rows.

In this example, periodic provision of land-free or vacant lattice sites at an interval enables efficient outward extension of wiring patterns.

As described herein, the present invention provides a multilayer wiring board in which wiring patterns are efficiently extended outward through a space provided by land-free or vacant sites which are suitably periodically located in a square lattice of lands even when the lattice is in the dimensional condition that no wiring pattern can pass through a space between two adjacent lands.

Vacant sites as small in number as about 10% based on the total lattice sites sufficiently ensures the efficient outward extension of wiring patterns to enable the number of wiring layers of a multilayer wiring board to be significantly reduced.

The present invention thus enables a multilayer wiring board to be produced in a minimized number of production steps with an improved reliability.

What is claimed is:

1. A multilayer wiring board having a plurality of wiring layers, in which each of said wiring layers includes lands arranged in the form of a square lattice and wiring patterns each having one end connected to one of said lands and the other end extending outward beyond an outermost row of said lattice, said lands having a land pitch p and a land diameter d and said wiring patterns having a pattern width w and an interpattern space s, said p, d, w and s satisfying the following relationship:

$$p-d<2s+w$$

and $$(\sqrt{2})p-d \geq 2s+w,$$

wherein said lattice has periodic land-free or vacant lattice sites, all lands in said outermost row have wiring patterns extending outward therefrom, and said land-free or vacant lattice sites provide a space through which wiring patterns extend outward from, and are connected to, lands of an inner row.

2. The multilayer wiring board of claim 1 wherein the number of land-free or vacant lattice sites is about 10% or less of the total lattice sites.

3. The multilayer wiring board of claim 2 wherein no wiring pattern can pass through a space between two adjacent lands.

4. The multilayer wiring board of claim 1 wherein the vacant lattice sites allow outward extension of wiring patterns from eight rows, including the outermost row, and wherein the wiring board has only four wiring layers.

* * * * *